United States Patent

Liang et al.

Patent Number: 5,979,784
Date of Patent: Nov. 9, 1999

[54] METHOD OF FORMING LOCAL INTERCONNECTION OF A STATIC RANDOM ACCESS MEMORY

[75] Inventors: Kuei-Chang Liang, Yungho; Yu-Hao Yang, Hsinchu, both of Taiwan

[73] Assignee: Winbond Electronics Corp., Hsinchu, Taiwan

[21] Appl. No.: 08/843,715

[22] Filed: Apr. 17, 1997

[30] Foreign Application Priority Data

Dec. 19, 1996 [TW] Taiwan .................................. 85115730

[51] Int. Cl.$^6$ ............................................... H01L 21/8244
[52] U.S. Cl. .......................... 238/738; 438/649; 438/655; 438/227; 438/232
[58] Field of Search ...................................... 438/238–242, 438/381–385, 648–649, 651–655, 663–664, 682, 196, 227, 232

[56] References Cited

U.S. PATENT DOCUMENTS 5,341,014  8/1994  Fujii et al. .
5,635,426  6/1997  Hayashi et al. .

*Primary Examiner*—Jey Tsai
*Attorney, Agent, or Firm*—Finnegan, Henderson, Farabow, Garrett & Dunner, L.L.P.

[57] ABSTRACT

A method of forming local interconnection of a SRAM, including the following steps: First, an NMOS and a PMOS are formed on a P-well and an N-well on a substrate, respectively. An isolation oxide layer is formed and the isolation oxide layer on a node is removed. A thin polysilicon layer is formed and N+ shallow implantation and N+ deep implantation is performed by using a photolithography technique. Also, P+ shallow implantation and P+ deep implantation are performed by using a photolithography technique. After the formation of a low resistance material, the low resistance material and the thin polysilicon layer are together formed.

19 Claims, 3 Drawing Sheets

METHOD OF FORMING LOCAL INTERCONNECTION OF A STATIC RANDOM ACCESS MEMORY

BACKGROUND OF THE INVENTION

1. Field of the Invention

The invention relates in general to the fabrication of semiconductor integrated circuits (ICs), and more particularly to a method of forming local interconnection of a static random access memory.

2. Description of the Related Art

Due to the requirement of size shrinking of metal oxide semiconductors (MOS) and high integrity, several problems related to local interconnection formation occur. Fabricating contact windows of smaller size increases photo budget and also increases contact resistance, as a result, the performance of the ICs gets worse. Static Random Access Memory (SRAM) is a widely used device which uses a polysilicon layer for interconnecting the polysilicon gate and the source/drain region.

Typically, metal or polysilicon is used to connect the N+ node and the P+ node of an SRAM. In FIG. 1, polysilicon is taken as an example to be used as the material for interconnection between a N+ node 13 and a P+ node 14. An NMOS is formed in P-well 10 and a PMOS is formed in N-well 11. Self-aligned contacts 12 (SAC) are formed around the N+ node 13 and the P+ node 14 and the poly gate 15 is formed to connect and above the NMOS and the PMOS. However, as polysilicon is used for interconnection, it should be doped with N+ dopant or P+ dopant and therefore source/drain region can be formed consequently. As shown in FIG. 1, polysilicon 16 on N+ region must be N+ doped, polysilicon 17 on P+ region must be P+ doped before the back-end process of source/drain region formation, which increases the frequency of performing photolithography and rises the cost. As metal is used for interconnection, the isolation of metal and gate becomes an issue.

SUMMARY OF THE INVENTION

It is therefore an object of the invention to provide a process for interconnection, wherein a split poly method is utilized. Also, the implantation process of the polysilicon and the source/drain regions can be completed in a single step, using a single mask.

It is another object of the invention to provide a method of forming local interconnection of a SRAM, including the following steps: First, an NMOS and a PMOS are formed on a P-well and an N-well on a substrate, respectively. An isolation oxide layer is formed and the isolation oxide layer on a node is removed. A thin polysilicon layer is formed and N+ shallow implantation and N+ deep implantation is performed by using a photolithography technique. Also, P+ shallow implantation and P+ deep implantation are performed by using a photolithography technique. After the formation of a low resistance material, the low resistance material and the thin polysilicon layer are together formed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
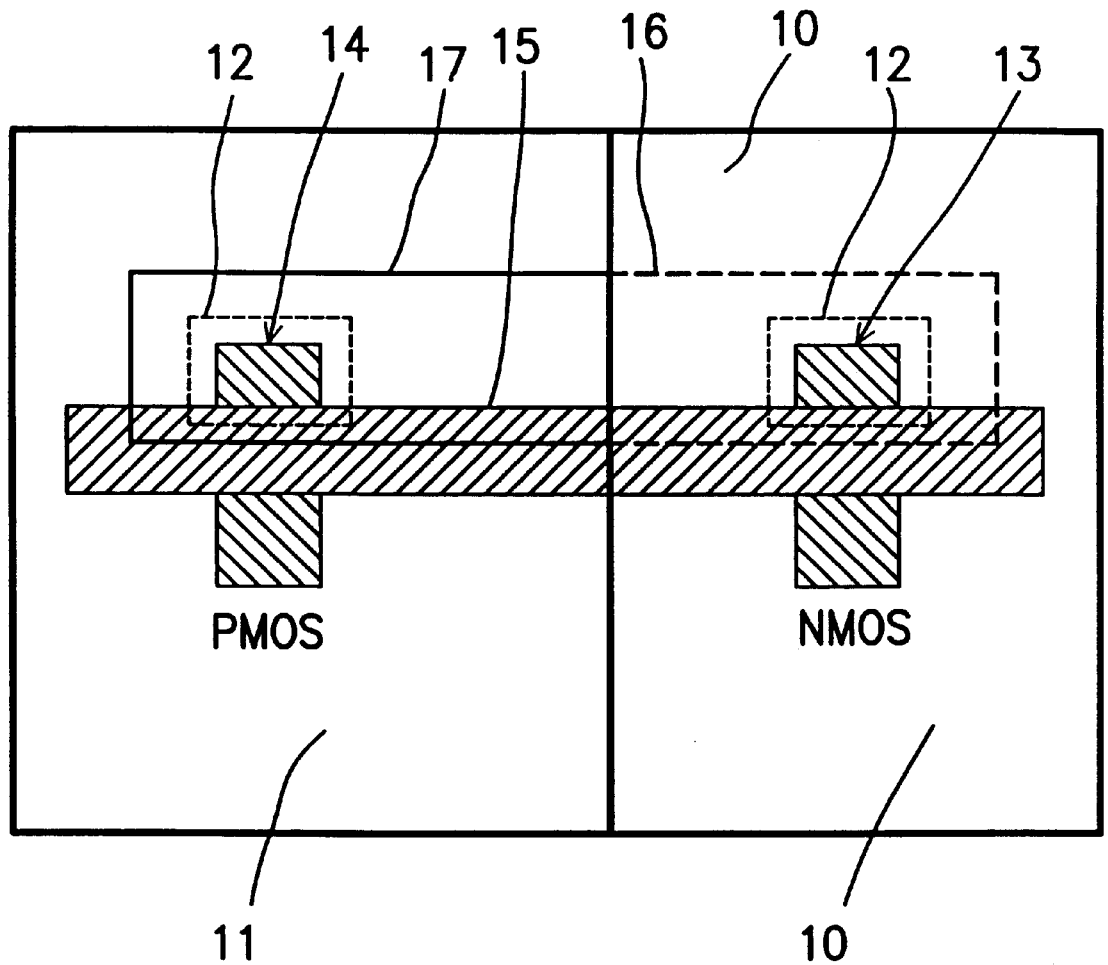
FIG. 1 is a top view of the conventional SRAM interconnection.
Figure 2A:
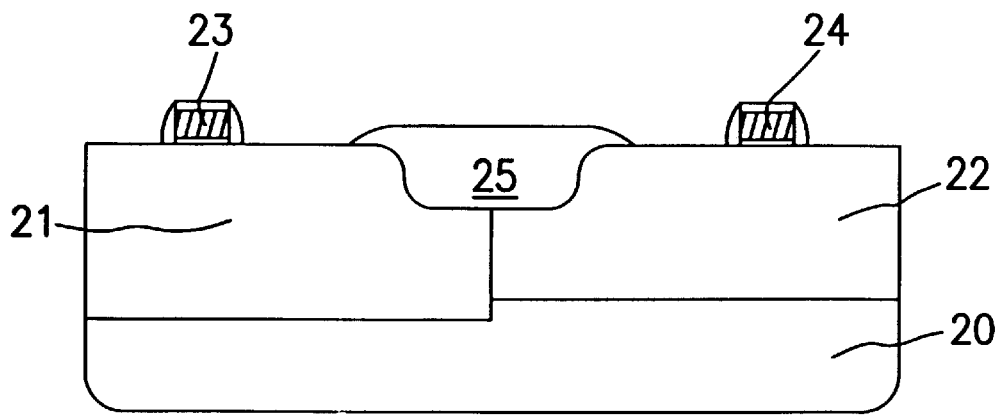
FIGS. 2A to 2E are cross-sectional views showing the process steps of forming interconnection of a SRAM according to the invention.

Referring to FIG. 2A, a gate 23 and a gate 24 are formed on a P-well 21 and N-well 22 of a silicon substrate 20, respectively, wherein field oxide 25 is already formed on the silicon substrate 20. Since the above-mentioned devices can be formed according to conventional processes, they will not be described herein.

Figure 2B:
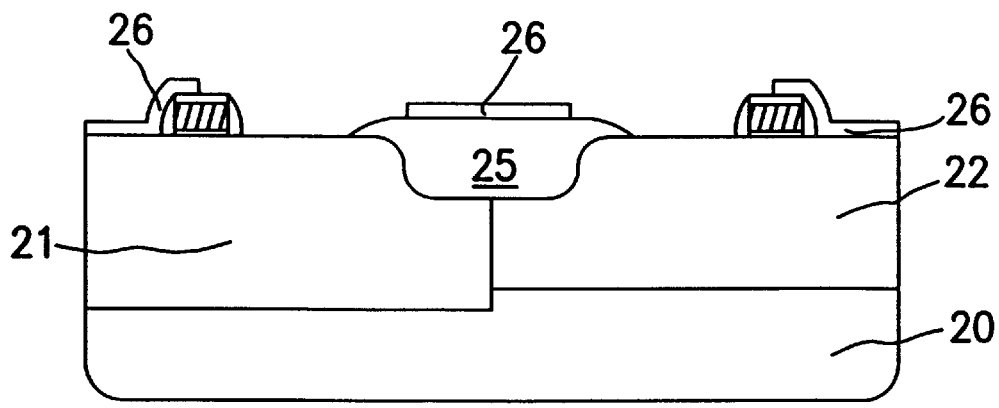

Next, referring to FIG. 2B, an isolation oxide layer, having a thickness of about 50 Å to 2000Å, is formed over the silicon substrate 20. Then, the oxide layer is etched to leave an oxide layer 26 shown in FIG. 2B. The isolation oxide layer 26 is used for the isolation for the local interconnection and the thickness of the isolation oxide layer 26 is preferred to be thin enough to contribute the etching process.

Figure 2C:
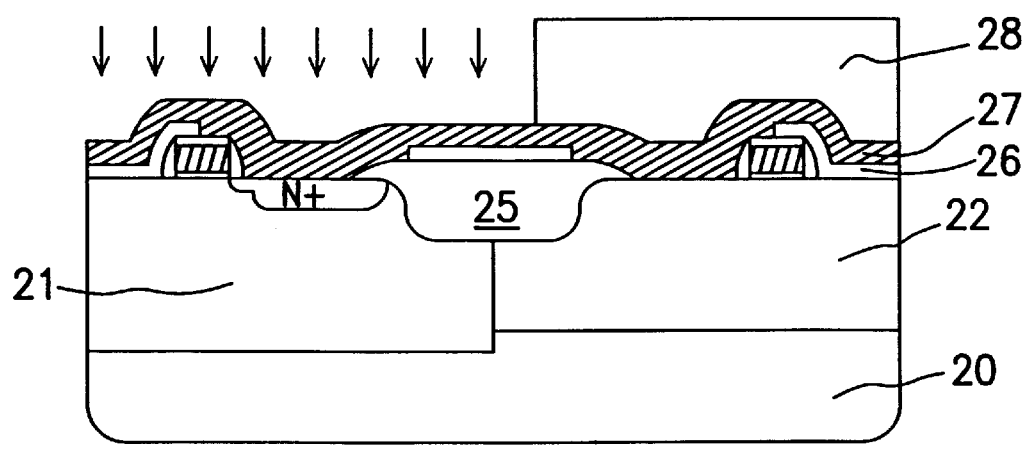

Then, referring to FIG. 2C, a thin polysilicon layer 27, having a thickness of about 200Å to 2000Å, is deposited. A photoresist layer 28 is then formed to approximately cover the N-well 22. A shallow N+ implantation is performed to reduce the resistance of the polysilicon over the node and a deep N+ implantation is then performed to form the source/drain region of the MOS. For the shallow N+ implantation, N+ type ions, such as phosphorous or arsenic, having a dosage of about 1E14 to 5E16 atoms/cm$^2$, are implanted with an energy level of about 10 KeV to 50 KeV. For the deep N+ implantation, N+ type ions, such as phosphorous or arsenic, having a dosage of about 1E14 to 5E16 atoms/cm$^2$, are implanted with an energy level of about 70 KeV to 140 KeV.

Figure 2D:
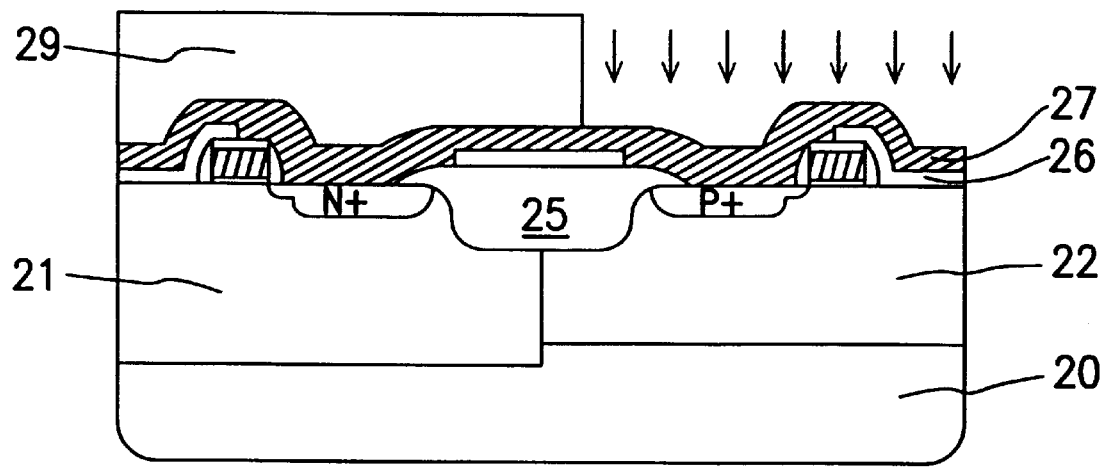

Next, referring to FIG. 2D, a photoresist layer 29 is then formed to approximately cover the P-well 21. A shallow P+ implantation is performed to reduce the resistance of the polysilicon over the node and a deep P+ implantation is then performed to form the source/drain region of the MOS. For the shallow P+ implantation, P+ type ions, such as boron or $BF_2$, having a dosage of about 1E14 to 5E16 atoms/cm$^2$, are implanted with an energy level of about 10 KeV to 50 KeV. For the deep P+ implantation, P+ type ions, such as boron or $BF_2$, having a dosage of about 1E14 to 5E16 atoms/cm$^2$, are implanted with an energy level of about 70 KeV to 140 KeV. The source/drain regions of both the NMOS and PMOS are formed by implanting ions through the thin polysilicon layer 27. Therefore, the junction depth of the source/drain region can be controlled to be very shallow, which contributes the quality of deep sub-micron devices.

Figure 2E:
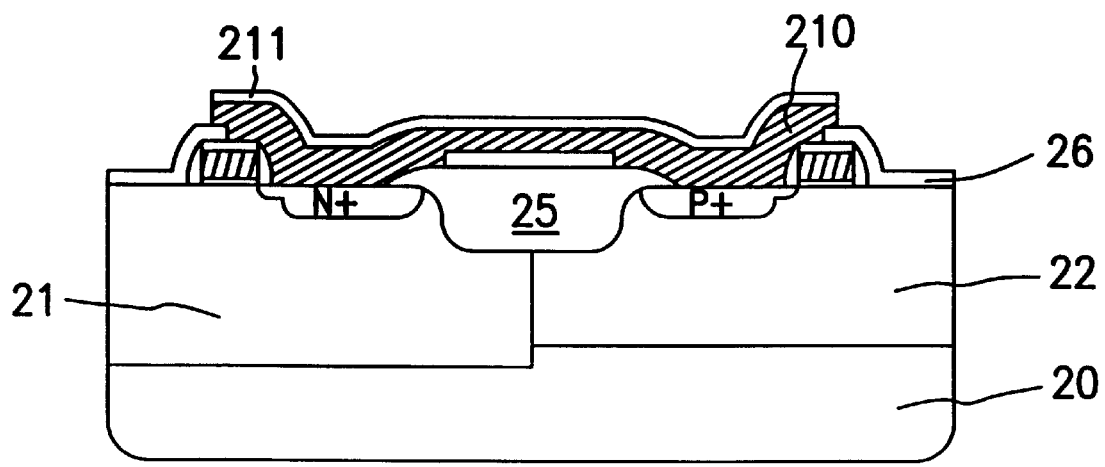

Referring to FIG. 2E, a material with low resistance, such as tungsten silicide or titanium/titanium nitride, can be deposited over the thin polysilicon layer 27. The low resistance material and the thin polysilicon layer 27 are then etched to form the patterned low resistance material 211 and the polysilicon layer 210. As shown in FIG. 2E, the polysilicon layer 210 forms the lower layer of the local interconnection and the low resistance material forms the upper layer of the local interconnection.

To sum up, the local interconnection according to the above-mentioned preferred embodiment has the following advantages:

1. The thickness of the isolation oxide layer for the isolation between the gate and the local interconnection can be formed thin. Consequently, the etching process of the isolation oxide is easily controlled.

2. N+ or P+ shallow implantation for reducing the resistance of the polysilicon and N+ or P+ deep implantation for forming the source/drain region can be performed by using the same photomask. The process step is therefore simplified and the cost is cut down.

3. Using the polysilicon for local interconnection helps the complete etching of the polysilicon in further processes since the high selectivity of the polysilicon and the isolation oxide layer.

4. Due to the fact that source/drain ion implantation are performed through a thin polysilicon layer, the junction depth of the source/drain region can be adjusted to be shallow, which contributes the quality of deep sub-micron devices.

5. Because source/drain ion implantation are performed through a thin polysilicon layer, the damage and contamination caused by ion implantation can be isolated by the thin polysilicon layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a local interconnection of a static random access memory having a node comprising the steps of:

(a) providing a silicon substrate with a P-well and an N-well, wherein a first gate and a second gate are respectively formed on the P-well and N-well;

(b) depositing an isolation oxide layer and removing the isolation oxide layer on the node;

(c) depositing a thin polysilicon layer and subsequently performing N+ shallow implantation to reduce a resistance of the polysilicon layer over the node and N+ deep implantation to form a first source/drain region by using a photolithography technique;

(d) performing P+ shallow implantation to reduce a resistance of the polysilicon layer over the node and P+ deep implantation to form a second source/drain region by using a photolithography technique; and (e) depositing a low resistance material and patterning the low resistance material and the thin polysilicon layer.

2. A method as claimed in claim 1, wherein the isolation oxide layer has a thickness of about 50Å to 2000 Å.

3. A method as claimed in claim 1, wherein the thin polysilicon has a thickness of about 200Å to 2000 Å.

4. A method as claimed in claim 1, wherein an energy level for shallow N+ implantation is about 10 KeV to 50 KeV.

5. A method as claimed in claim 1, wherein a dosage of shallow N+ implantation is about $1.0 \times 10^{14}/cm^2$ to $5.0 \times 10^{16}/cm^2$.

6. A method as claimed in claim 1, wherein an energy level for deep N+ implantation is about 70 KeV to 140 KeV.

7. A method as claimed in claim I, wherein a dosage of deep N+ implantation is about $1.0 \times 10^{14}/cm^2$ to $5.0 \times 10^{16}/cm^2$.

8. A method as claimed in claim 1, wherein in said step (c), phosphorous is used as an N+ dopant.

9. A method as claimed in claim 1, wherein in said step (c), arsenic is used as an N+ dopant.

10. A method as claimed in claim 1, wherein an energy level for shallow P+ implantation is about 10 KeV to 50 KeV.

11. A method as claimed in claim 1, wherein a dosage of shallow P+ implantation is about $1.0 \times 10^{14}/cm^2$ to $5.0 \times 10^{16}/cm^2$.

12. A method as claimed in claim 1, wherein an energy level for deep P+ implantation is about 70 KeV to 140 KeV.

13. A method as claimed in claim 1, wherein a dosage of deep P+ implantation is about $1.0 \times 10^{14}/cm^2$ to $5.0 \times 10^{16}/cm^2$.

14. A method as claimed in claim 1, wherein in said step (d), boron is used as an P+ dopant.

15. A method as claimed in claim 1, wherein in said step (d), $BF_2$ is used as an P+ dopant.

16. A method as claimed in claim 1, wherein the N+ and P+ shallow implantation adjust the resistance of the thin polysilicon.

17. A method as claimed in claim 1, wherein the local interconnection includes an upper layer of the low resistance material and a lower layer of the thin polysilicon layer.

18. A method as claimed in claim 17, wherein the low resistance material is tungsten silicide.

19. A method as claimed in claim 17, wherein the low resistance material is tungsten/tungsten nitride.

* * * * *